United States Patent
Lee

(10) Patent No.: US 10,424,747 B2
(45) Date of Patent: Sep. 24, 2019

(54) SUBSTRATE FOR ORGANIC ELECTRONIC DEVICE AND METHOD OF MANUFACTURING THE SAME

(71) Applicant: LG CHEM, LTD., Seoul (KR)

(72) Inventor: Jung Hyoung Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/908,033

(22) PCT Filed: Sep. 30, 2014

(86) PCT No.: PCT/KR2014/009218
§ 371 (c)(1),
(2) Date: Jan. 27, 2016

(87) PCT Pub. No.: WO2015/047036
PCT Pub. Date: Apr. 2, 2015

(65) Prior Publication Data
US 2016/0164013 A1    Jun. 9, 2016

(30) Foreign Application Priority Data

Sep. 30, 2013 (KR) ......... 10-2013-0116188
Sep. 30, 2014 (KR) ......... 10-2014-0131579

(51) Int. Cl.
*H01L 51/00* (2006.01)
*H01L 51/52* (2006.01)
(Continued)

(52) U.S. Cl.
CPC ......... *H01L 51/0097* (2013.01); *B32B 7/00* (2013.01); *B32B 7/02* (2013.01); *B32B 9/00* (2013.01);
(Continued)

(58) Field of Classification Search
CPC ............... H01L 51/0097; H01L 51/5256
See application file for complete search history.

(56) References Cited

U.S. PATENT DOCUMENTS

| 6,184,680 B1 * | 2/2001 | Shinoura ......... B82Y 25/00 |
| | | 324/207.21 |
| 9,444,062 B2 | 9/2016 | Becker et al. |
| | (Continued) | |

FOREIGN PATENT DOCUMENTS

| CN | 1957485 A | 5/2007 |
| CN | 101945965 A | 1/2011 |
| | (Continued) | |

OTHER PUBLICATIONS

"Complex Index of Refraction Look-up Utility", Brigham Young University (2009), http://www.photonics.byu.edu/opticalconstants.phtml.*

(Continued)

*Primary Examiner* — Michele Fan
(74) *Attorney, Agent, or Firm* — Dentons US LLP

(57) ABSTRACT

Provided are a substrate for an OED, a method of manufacturing the same, and a use thereof. The substrate includes a flexible base film and an inorganic material layer, and the inorganic material layer includes a multilayer structure of at least two thin layers. Such an inorganic material layer may have an excellent physical property, for example, a barrier property, by inhibiting crystallinity. In addition, by employing the multilayer structure, an inorganic material layer having a physical property which is difficult to be realized by a conventional inorganic material layer, for example, a high refractive index, in addition to the barrier property may be formed.

10 Claims, 2 Drawing Sheets

(51) Int. Cl.
    *H01L 51/56*    (2006.01)
    *B32B 27/00*    (2006.01)
    *B32B 7/00*     (2019.01)
    *B32B 7/02*     (2019.01)
    *B32B 9/00*     (2006.01)
    *B32B 9/04*     (2006.01)
    *B32B 19/00*    (2006.01)
    *B32B 19/04*    (2006.01)

(52) U.S. Cl.
    CPC ............... *B32B 9/04* (2013.01); *B32B 19/00* (2013.01); *B32B 19/04* (2013.01); *B32B 27/00* (2013.01); *H01L 51/5256* (2013.01); *H01L 51/5275* (2013.01); *H01L 51/56* (2013.01); *B32B 2264/00* (2013.01); *B32B 2264/10* (2013.01); *B32B 2264/102* (2013.01); *B32B 2307/00* (2013.01); *B32B 2307/40* (2013.01); *B32B 2307/418* (2013.01); *B32B 2307/546* (2013.01); *B32B 2307/7242* (2013.01); *B32B 2307/732* (2013.01); *B32B 2457/00* (2013.01); *H01L 51/5268* (2013.01); *H01L 2251/5338* (2013.01); *H01L 2251/558* (2013.01); *Y02E 10/549* (2013.01); *Y02P 70/521* (2015.11)

(56) References Cited

U.S. PATENT DOCUMENTS

| | | | | |
|---|---|---|---|---|
| 2001/0053425 | A1* | 12/2001 | Umehara | B29C 39/203 428/1.6 |
| 2003/0027369 | A1 | 2/2003 | Yamazaki | |
| 2003/0207050 | A1* | 11/2003 | Hay | C08G 64/06 428/1.6 |
| 2004/0027672 | A1* | 2/2004 | Bourdelais | G02B 5/287 359/586 |
| 2004/0195967 | A1* | 10/2004 | Padiyath | B32B 27/08 313/512 |
| 2007/0281174 | A1 | 12/2007 | Moro et al. | |
| 2008/0054802 | A1* | 3/2008 | Cok | H01L 51/5284 313/506 |
| 2009/0039349 | A1* | 2/2009 | Honda | H01L 27/1214 257/59 |
| 2010/0272933 | A1* | 10/2010 | McCormick | C09J 7/0296 428/34.1 |
| 2011/0070456 | A1* | 3/2011 | Philippens | H01L 51/0097 428/523 |
| 2011/0143129 | A1* | 6/2011 | Padiyath | B05D 7/58 428/336 |
| 2012/0132953 | A1* | 5/2012 | Becker | H01L 51/448 257/100 |
| 2012/0208033 | A1* | 8/2012 | Weigel | B32B 17/10018 428/447 |
| 2012/0258295 | A1 | 10/2012 | Leyder et al. | |
| 2013/0040102 | A1 | 2/2013 | Gleason et al. | |
| 2014/0186587 | A1* | 7/2014 | Shin | H05K 1/09 428/172 |
| 2014/0356524 | A1* | 12/2014 | Gao | H01B 1/02 427/126.1 |
| 2015/0015950 | A1* | 1/2015 | Schmidt | C09D 4/00 359/489.07 |
| 2016/0362583 | A1* | 12/2016 | Naik | G09F 3/10 |
| 2017/0098799 | A1 | 4/2017 | Ramadas et al. | |

FOREIGN PATENT DOCUMENTS

| | | |
|---|---|---|
| CN | 102097595 A | 6/2011 |
| CN | 102576817 A | 7/2012 |
| CN | 102683379 A | 9/2012 |
| EP | 1983591 | 4/2016 |
| JP | 2001126861 A | 5/2001 |
| JP | 2008532814 | 8/2008 |
| JP | 2010-511267 | 4/2010 |
| JP | 2011150803 A | 8/2011 |
| JP | 2011241421 A | 12/2011 |
| JP | 2012131231 | 7/2012 |
| JP | 2012521623 | 9/2012 |
| JP | 2012521623 A | 9/2012 |
| KR | 10-2012-0090380 A | 8/2012 |
| WO | 2013009913 A2 | 1/2013 |
| WO | 2013-122055 A1 | 8/2013 |

OTHER PUBLICATIONS

Minton et al., "Protecting Polymers in Space with Atomic Layer Deposition Coatings," Applied Materials & Interfaces 2(9): 2515-2520 (2010).

Mitchell et al., "Atomic layer deposition of TiO2 and Al2O3 thin films and nanolaminates," Smart Mater. Struct. 15: S57-S64 (2006).

Triani et al., "Atomic Layer Deposition of TiO2/Al2O3 Films for Optical Applications," Advances in Thin-Film Coatings for Optical Applications II, Proc. of SPIE—International Society for Optical Engineering. Proceedings 5870: 587009-1 to 587009-10 (2005).

* cited by examiner

[Fig. 1]
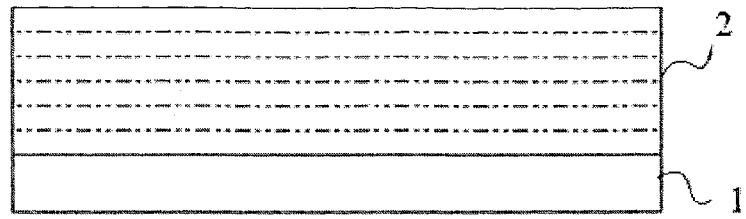
[Fig. 2]
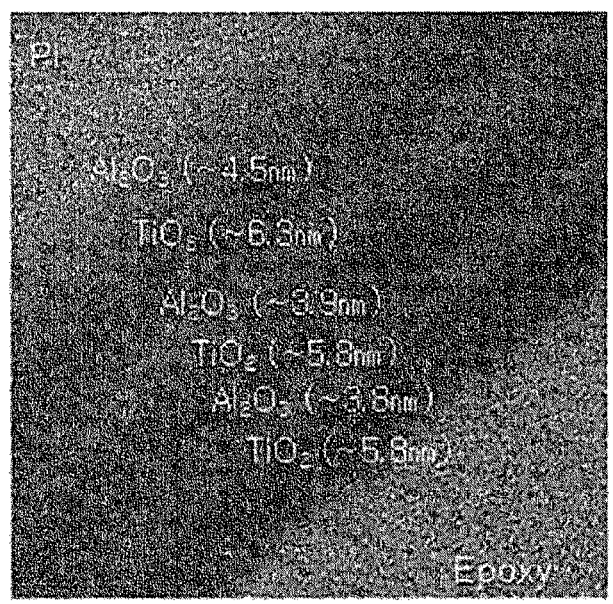

[Fig. 3]
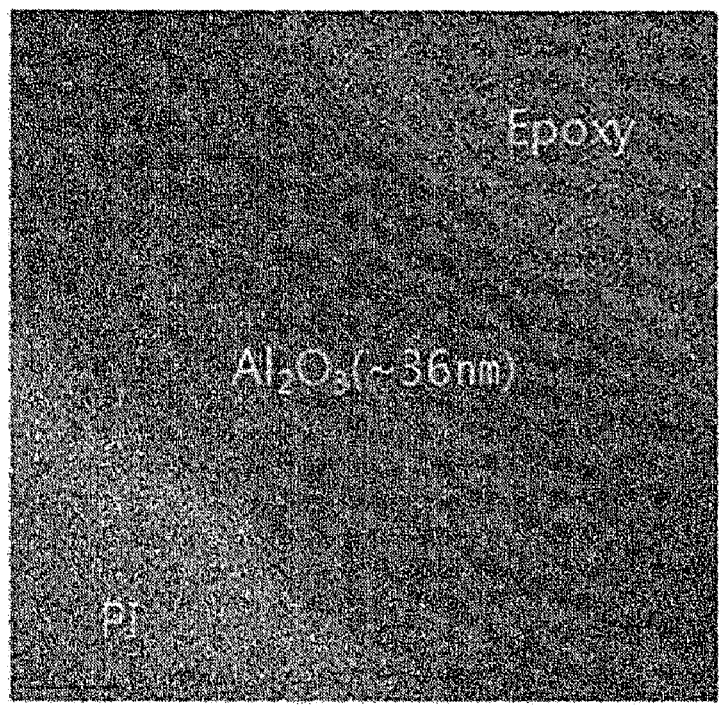

SUBSTRATE FOR ORGANIC ELECTRONIC DEVICE AND METHOD OF MANUFACTURING THE SAME

CROSS-REFERENCE TO RELATED APPLICATION

This application is a National Stage Application of International Application No. PCT/KR2014/009218, filed Sep. 30, 2014, and claims priority to and the benefit of Korean Patent Application No. 10-2013-0116188, filed Sep. 30, 2013, and Korean Patent Application No. 10-2014-0131579, filed Sep. 30, 2014, the contents of which are incorporated by reference in their entirety for all purposes as if fully set forth below.

BACKGROUND

1. Field of the Invention

The present application relates to a substrate for an organic electronic device (OED), a method of manufacturing the same, and a use thereof.

2. Discussion of Related Art

An OED is a device including at least one of layers of, for example, an organic material, which can conduct a current. Types of the OED include an organic light emitting device (OLED), an organic photovoltaic cell, an organic photo conductor (OPC), or an organic transistor.

Conventionally, the OLED, which is a representative of the OED, sequentially includes a substrate, a first electrode layer, an organic layer, and a second electrode layer. The OLED may be classified as a top emission device, a bottom emission device, and a both-side emission device. In a structure, which is called as a bottom emission device, a first electrode layer may be formed as a transparent electrode layer, and a second electrode layer may be formed as a reflective electrode layer, in a structure, which is called as a top emission device, a first electrode layer may be formed as a reflective electrode layer, and a second electrode layer may be formed as a transparent electrode layer, and in a structure which is called as a both-side emission device, both of a first electrode layer and a second electrode layer may be transparent electrode layers. Electrons and holes injected by the electrode layers may be recombined in an emitting layer present in an organic layer, thereby generating light.

Recently, the increasing attention to a flexible OLED causes an increase in demand for technology of substituting a glass substrate with a plastic substrate in a structure of the OLED.

However, the plastic substrate is vulnerable to permeation of water and oxygen. Particularly, when a display device including an OLED using the plastic substrate is manufactured, the water and oxygen are permeated from the substrate, resulting in reducing a lifespan of the OLED.

Conventionally, to prevent the permeation of the water and oxygen to the plastic substrate, a single inorganic barrier layer was formed on a surface of the plastic substrate, or a structure in which an inorganic metal layer and an organic layer are stacked or a structure in which a plurality of inorganic barrier layers are stacked by means of a pressure-sensitive adhesive layer was used. However, despite such a structure, an adhesive strength between the barrier layer and the plastic substrate was decreased due to partial crystallization of the barrier layer, or a water vapor transmission rate (WVTR) required by an OLED display was not satisfied due to permeation of water.

REFERENCES

Reference 1: U.S. Pat. No. 6,226,890
Reference 2: U.S. Pat. No. 6,808,828
Reference 3: Japanese Patent Laid-Open No. 2000-145627
Reference 4: Japanese Patent Laid-Open No. 2001-252505

SUMMARY OF THE INVENTION

The present application is directed to providing a substrate for an OED, a method of manufacturing the same, and a use thereof.

Conventionally, a gas barrier property of a plastic substrate was obtained by forming a monolayer of an inorganic barrier layer on the plastic substrate, or stacking an inorganic layer/organic layer, or stacking an inorganic barrier layer using an adhesive layer.

However, an adhesive strength between the barrier layer and the plastic substrate is decreased due to partial crystallization of the barrier layer, or a water vapor transmission rate (WVTR) required by a display including an OED is not satisfied due to permeation of water.

One aspect of the present application provides a substrate for an OED satisfying a WVTR and an oxygen transmission rate required by a display including an OED by forming an inorganic material layer including a sub layer having a thickness of several nm or less on a base film to prevent crystallization of the inorganic material layer.

The exemplary substrate for an OED of the present application may include a flexible base film and an inorganic material layer. FIG. 1 is a diagram showing a case in which an inorganic material layer 2 is formed on a base film 1. Here, the inorganic material layer may be formed on one surface of the base film. The inorganic material layer of the present application includes a multilayer structure having at least two or more thin layers, and may have an excellent physical property, for example, a barrier property, by inhibiting crystallinity in the manufacturing process. In addition, an inorganic material layer having a physical property, for example, a high refractive index, which is difficult be given in the inorganic material layer having a barrier property by adopting the multilayer structure, may be formed.

A type of the flexible base film applied to the substrate of the present application is not particularly limited. For example, the flexible base film may be a flexible layer having a property known to be conventionally used in realization of a flexible device in the art as a base film, for example, an elastic modulus of 0.05 to 5,000 or 0.5 to 2,500 MPa.

A representative example of such a base film is a polymer film. The polymer film may be, but is not limited to, a film including triacetylcellulose, ethylenevinylalcohol, polyvinylidene chloride, polyacrylonitrile, polyethyleneterephthalate, polyethylenenaphthalate, poly(amic acid), polyarylate, polycarbonate, polymethacrylate, a cyclic olefin copolymer, polystyrene, polyethersulfone, polyimide, polynorbornene, polyamide, or polysulfone.

As the base film, to improve interface cohesion with the inorganic material layer, one to which a functional group capable of reacting with the inorganic material layer is introduced may be used. For example, a functional group such as a hydroxyl group, an amino group, or a carboxyl group may chemically react with an inorganic material layer formed by an ALD method which will be described below, thereby obtaining excellent cohesion as described above. A method of introducing the above-described functional group to the base film is not particularly limited, and for example, when a polymer forming the base film includes the above-described functional group, does not include the functional group, or includes the functional group only at a small amount, the functional group may be introduced by treating a surface of the base film with corona discharging or plasma treatment. To ensure suitable interface cohesion, a ratio in which the functional group is introduced may be controlled.

As the base film, a light-transmitting film may be used. As an example, when the substrate for an OED is applied to a bottom emission device, a light-transmitting base film, for example, a polymer film having a transmissivity to light in a visible region of 50, 60, or 70% or more may be used. Meanwhile, when the substrate for an OED is applied to a top emission device, the base film is not necessarily a light-transmitting film, and when needed, a reflective layer may be formed on a surface of the base film A using a reflective material such as aluminum. The base film may be a thin film transistor (TFT) base film in which a driving TFT is present.

When the substrate is applied to a bottom emission device, the substrate having a haze may be used. When the substrate has a haze, the haze of the base film may be in a range of 3 to 90%. Another lower limit of the haze may be, for example, approximately 85, 80, 75, 70, 65, 60, 55, 45, 40, 35, or 30%. That is, the substrate of the present application may have a haze of 3 to 30%.

A method of providing a haze to the base film is not particularly limited, and a conventionally applied method to generate a haze may be applied. For example, when the base film is a polymer film, a method of adding scattering particles having a different refractive index from that of a peripheral polymer matrix and a suitable average particle diameter, or a method of polymerizing a monomer which can generate a haze to a polymer, for example, a monomer exhibiting a refractive index within a different range from the main chain of the polymer and forming a film using such a polymer may be applied.

The base film may have a coefficient of thermal expansion (CTE) of approximately 5 to 70 ppm/° C. Such a range may be advantageous to prevent a fault of interlayer delamination which can occur in a structure in which an organic material layer and an inorganic material layer are mixed.

The base film may have a glass transition temperature of approximately 200° C. or more. Such a glass transition temperature may be a glass transition temperature of the base film itself, or a glass transition temperature of the base film having a buffer layer which will be described below. Such a range may be suitable for a high temperature process for deposition or patterning in a process of manufacturing an OED. The glass transition temperature may be, in another example, approximately 210, 220, 230, 240, or 250° C. or more. The upper limit of the glass transition temperature may be, but is not particularly limited to, for example, approximately 400, 350, or 300° C.

A surface roughness (RMS, root mean square) of the base film may be controlled within a range of 0.1 to 5 nm. The surface roughness may be that of the base film itself, or that of a surface of a buffer layer, which will be described below and formed on the base film. Such a surface roughness range may be advantageous to improve performance of a layer to be formed on the base film. For example, when an inorganic material layer is formed to have a barrier property, if the inorganic material layer is formed on a surface having the above surface roughness range, the inorganic material layer may have more excellent water preventability. In another example, the surface roughness may be approximately 4, 3, 2.5, or 2 nm or less.

The base film may have a refractive index of approximately 1.5, 1.6, 1.7, 1.75, or 1.8 or more. The term "refractive index" used herein is, unless particularly defined otherwise, a refractive index measured from light having a wavelength of approximately 550 nm. In the OLED, the range of the refractive index of the base film may be advantageous to increase light efficiency of the device. The upper limit of the refractive index of the base film may be, but is not particularly limited to, for example, approximately 2.0.

Such a high refractive index of the base film may be achieved by manufacturing the base film using a polymer having a high refractive index, or by blending a component having a high refractive index in the film in the process of manufacturing the base film.

A thickness of the base film is not particularly limited, and may be selected in a suitable range in consideration of desired performance, for example, flexibility, light extraction efficiency, or a barrier property. For example, the thickness of the base film may be approximately 10 to 50 or 20 to 30 μm.

An inorganic material layer is present on the base film. The term "inorganic material layer" used herein may be, for example, a layer including 50 or 60% or more of an inorganic material based on a weight. The inorganic material layer may include only an inorganic material or a different component such as an organic material as long as an inorganic material is included within the above range.

The inorganic material layer may be, for example, a barrier layer. The term "barrier layer" used herein may be a layer which can prevent, inhibit, or reduce permeation of external factors, for example, water or vapor, which can give a bad influence on the performance of the device such as an organic material layer. For example, the barrier layer may be a layer having a WVTR of $10^{-6}$ to $10^{-3}$ g/m²/day. The term "WVTR" used herein may be a value measured using a measurer (for example, PERMATRAN-W3/W31, MOCON, Inc.) at 40° C. and a relative humidity of 90%.

The barrier layer may be formed of a material known to reduce, prevent, or inhibit the permeation of external factors such as water and oxygen. Such a material may include a metal such as In, Sn, Pb, Au, Cu, Ag, Zr, Hf, Zn, Al, Si, La, Ti, or Ni; an oxide of the metal; a nitride of the metal; an oxynitride of the metal; a fluoride of the metal; an water-absorbing material having an absorbance of 1% or more; or a moisture-proof material having an absorption coefficient of 0.1% or less.

When the inorganic material layer is formed by a general deposition method, there is a high probability of performing crystallization, which is a property of the material, and a desired WVTR may not be obtained due to partial crystallization of the inorganic material layer. However, as any one of a method of forming an inorganic material layer which will be formed below using an oxide layer such as a metal oxide, a method of forming a thin layer multiple times, a method of controlling adjacent sub layers to have different materials during the repeated formation, and a method of forming each sub layer of a different material, which however is an oxide layer such as a metal oxide, is employed, the crystallization of the inorganic material layer may be prevented, and a desired WVTR required by a product including the substrate for an OED may be achieved.

It is suitable that the inorganic material layer has the smallest difference in a refractive index from that of the base film. In such a case, particularly, it may contribute to the formation of a substrate having excellent light extraction efficiency. For example, the absolute value of the difference in refractive index between the inorganic material layer and the base film may be approximately 1, 0.7, 0.5, or 0.3 or less. Accordingly, when the base film has a high refractive index as described above, the refractive index should be obtained in an equivalent level to that of the inorganic material layer. For example, the refractive index of the inorganic material layer may be approximately 1.8, 1.85, 1.9, or 2.0 or more. In the present application, when an OED to which the substrate is applied is an OLED, a range of the refractive index of the base film may be advantageous to increase light efficiency of the device. The upper limit of the refractive index of the inorganic material layer may be, but is not particularly limited to, for example, approximately 2.2. That is, the refractive index of the inorganic material layer of the present application may be 1.8 to 2.2.

A thickness of the inorganic material layer may be determined according to an effect according to a desired use, and a range of the thickness may be, but is not particularly limited to, in one example, approximately 10 to 100, 10 to 90, 10 to 80, 10 to 70, 10 to 60, 10 to 50, or 20 to 50 nm.

The inorganic material layer may have a monolayer or multilayer structure, but should be a multilayer structure to satisfy a crystallization degree as described above. The multilayer structure may include a structure in which the same type or different types of inorganic material layers are stacked. Formation of the inorganic material layer in a multilayer structure may contribute to the formation of an inorganic material layer having the above-described interface cohesion and the above-described crystallization degree. In addition, the formation of the inorganic material layer in a multilayer structure may contribute to the formation of the inorganic material layer having the above-described refractive index.

When the inorganic material layer is formed in a multilayer structure, a structure in which at least a first sub layer and a second sub layer are stacked may be included. In consideration of the interface cohesion, crystallization degree, barrier property, and refractive index required by the inorganic material layer, thicknesses of the first and second sub layers may be controlled. For example, the thicknesses of the first and second sub layers may be controlled within a range of 7, 6, 5, 4, 3, or 2 nm or less. The lower limit of the thickness of the sub layer is not particularly limited. The smaller the thickness of the sub layer, the higher the contribution to the control of the interface cohesion, crystallization degree, barrier property, and refractive index. However, the smaller the thickness of the sub layer, the higher the number of a process required to reach the desired thickness. Accordingly, the lower limit of the thickness of the sub layer may be set within a suitable range in consideration of the desired thickness, and may be controlled within a range of, for example, approximately 0.1 nm or more.

In consideration of the interface cohesion, crystallization degree, barrier property, and refractive index, the thicknesses of all of the sub layers included in the inorganic material layer having a multilayer structure may be controlled in the above range. In this case, the inorganic material layer may not include a sub layer having a thickness of 10, 9, or 8 nm, and preferably, more than 7 nm.

The number of sub layers included in the inorganic material layer is not particularly limited. The number of sub layers may be determined according to the thickness of the sub layer and the desired thickness of the inorganic material layer. In one example, the inorganic material layer may include 2 to 50 sub layers. In this range, the inorganic material layer may include 4, 6, 8, or 10 sub layers or more. In addition, in the above range, the inorganic material layer may include 45, 40, 35, 30, 25, 20, or 15 sub layers or less. When the inorganic material layer includes 3 sub layers or more, all of the sub layers may be the first and second sub layers, and additionally, a third sub layer or a higher sub layer may also be included.

The sub layer may be formed of various materials, but to contribute to the interface cohesion, crystallization degree, barrier property, and refractive index, may be formed of the above-described material for forming the inorganic material layer, for example, a metal such as In, Sn, Pb, Au, Cu, Ag, Zr, Hf, Zn, Al, Si, La, Ti, or Ni; an oxide of the metal; a nitride of the metal; an oxynitride of the metal; or a fluoride of the metal. Accordingly, the first and second sub layers may be an oxide layer, a nitride layer, or an oxynitride layer. When needed, all of the sub layers included in the inorganic material layer may be formed of the oxide. In this case, the type of the oxide is not particularly limited, and may be suitably selected from the above-described oxides capable of forming the barrier layer. Among the sub layers, those in contact with each other may contribute to the interface cohesion, crystallization degree, barrier property, and refractive index as long as these are formed of different materials. Accordingly, when the first and second sub layers are in contact with each other, they may be formed of different materials, for example, different oxides, nitrides, or oxynitrides. Even when the inorganic material layer includes a third sub layer, a fourth sub layer, or a higher sub layer as described above, the sub layers in contact with each other may also be formed of different materials, for example, different oxides.

The first sub layer may have a first refractive index, and the second sub layer may have a second refractive index different from the first refractive index. When such a layer is stacked, it may be advantageous to ensure the above-described effect and control the refractive index of the inorganic material layer within the above-described range. The absolute value of the difference between the first and second refractive indexes may be, for example, 0.1 or more. The absolute value may be, in another example, 0.2, 0.3, 0.4, 0.5, or 0.6 or more. In addition, the absolute value may be, in another example, 2, 1.8, 1.6, 1.4, or 1.2 or less. Each range of the first and second refractive indexes is not particularly limited as long as the range of the refractive index is ensured. However, for example, the refractive index of the first sub layer may be in a range of 1.4 to 1.9, and the refractive index of the second sub layer may be in a range of 2.0 to 2.6. The first and second sub layers may be a metal oxide layer, respectively.

More particularly, the barrier layer including the material and the shape may have a structure in which, for example, an $Al_2O_3$ layer as a first sub layer and a $TiO_2$ layer as a second sub layer are alternately stacked by repeatedly performing sequential formation of the $Al_2O_3$ layer and the $TiO_2$ layer on the base film. In addition, as the second sub layer, instead of the $TiO_2$ layer, a layer satisfying the above range of the refractive index formed of, for example, $ZrO_2$, $HfO_2$, $La_2O_5$, or $TaO_5$ may be formed.

The inorganic material layer or each sub layer may be formed by a known method, but to ensure the interface cohesion, it is preferable that the inorganic material layer or each sub layer is formed by atomic layer deposition (ALD). The ALD may include a process of alternately depositing a precursor such as an organic metal and a precursor such as water on an adherend surface, and in this process, monolayers of the precursors may be alternately formed. More detailed descriptions will be provided. When a predetermined functional group, for example, the above-described hydroxyl group, is included in the base film, a layer formed by the ALD may react with the functional group in the formation thereof, thereby ensuring desired interface cohesion. Unless particularly defined otherwise, the ALD layer may refer to an inorganic material layer formed by the ALD.

A method of forming an inorganic material layer or a sub layer which can be applied, other than the ALD, may include physical vapor deposition (PVD) such as sputtering, pulsed laser deposition (PLD), electron beam evaporation, thermal evaporation, or laser molecular beam epitaxy (L-MBE), or a chemical vapor deposition (CVD) such as metal organic chemical vapor deposition (MOCVD), hydride vapor phase epitaxy (HVPE), initiated chemical vapor deposition (iCVD), or plasma enhanced chemical vapor deposition (PECVD). When needed, a suitable one of the above methods may be selected according to a material to be used, thereby maximizing performance of the inorganic material layer.

Another aspect of the present application provides an OED including the substrate for an OED.

The OED may include, for example, a substrate for an OED including a base film and an inorganic material layer; and a device region having a first electrode layer, an organic material layer, and a second electrode layer present on the inorganic material layer of the substrate for an OED.

As the first and second electrode layers, a hole injection or electron injection electrode layer conventionally used in the OED may be used. The electrode layer may be a transparent electrode layer, or a reflective electrode layer.

The hole injection electrode layer may be formed of, for example, a material having a relatively high work function, and when needed, may be formed of a transparent or reflective material. For example, the hole injection electrode layer may include a metal, an alloy, an electro conductive compound or a mixture of at least two thereof having a work function of approximately 4.0 eV or more. Such a material may be a metal such as gold, CuI, indium tin oxide (ITO), indium zinc oxide (IZO), zinc tin oxide (ZTO), aluminum- or indium-doped zinc oxide, magnesium indium oxide, nickel tungsten oxide, an oxide such as ZnO, $SnO_2$, or $In_2O_3$, a metal nitride such as gallium nitride, a metal serenide such as zinc serenide, or a metal sulfide such as zinc sulfide. A transparent hole injection electrode layer may also be formed of a stack of a metal thin film such as Au, Ag, or Cu and a high refractive transparent material such as ZnS, $TiO_2$, or ITO.

The hole injection electrode layer may be formed by an optional means such as deposition, sputtering, chemical deposition, or an electrochemical means. In addition, the electrode layer formed according to its use may be patterned through a known photolithography or a process using a shadow mask.

The electron injection electrode layer may be, for example, formed using a material having a relatively low work function, and may be formed using a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

The substrate included in the OED may further include an intermediate layer between the electrode layer and the inorganic material layer, between the inorganic material layer and the base film, or between predetermined sub layers if the inorganic material layer has a multilayer structure. Such an intermediate layer may have a modulus of elasticity at 23° C. of 20 GPa or more. In another example, the modulus of elasticity may be 30, 40, or 50 GPa or more. The upper limit of the modulus of elasticity may be, but is not particularly limited to, for example, approximately 200, 180, 140, 120, or 100 GPa or less. Such an intermediate layer may serve to reduce a stress which can be generated between the inorganic material layer and the electrode layer, and therefore contribute to durability.

The intermediate layer may be formed of an inorganic material, an organic material, or an organic/inorganic combined material, which has the above-described modulus of elasticity. As the material used to form the intermediate layer, $TiO_2$, $Si_3N_4$, MgO, $Al_2O_3$, ZnO, or $ZrO_2$ may be used.

The intermediate layer may be formed by various methods. However, to control capability of reaching the above-described modulus of elasticity, film qualities, interface cohesion, and refractive index, the intermediate layer may be formed by the ALD described above, MLD, or iCVD. Accordingly, the intermediate layer may be an ALD layer, an MLD layer, or an iCVD layer. As described above, the ALD layer means a layer formed by ALD, and the MLD layer or the iCVD layer means a layer formed by MLD or iCVD, respectively. Here, the MLD is very similar to the ALD, and in this process, a molecular fragment including an organic material or an inorganic material may be deposited. For example, an organic/inorganic combined material may be formed by alternately depositing a material capable of forming an inorganic component and a liquid such as ethylene glycol or an oxygen source by the MLD, and therefore the modulus of elasticity can be effectively controlled. The iCVD is a polymer vapor deposition process using an initiator, and according to a material, an excellent intermediate layer can be formed by applying the method.

The thickness of the intermediate layer may be determined by considering a desired effect, for example, a modulus of elasticity, but the present application is not particularly limited.

The intermediate layer may be formed of, for example, a material having a low refractive index of approximately 1.47 to 1.7, or a material having a high refractive index of 1.8 or more. When the intermediate layer is formed of a low refractive index material, the inorganic material layer may have a high refractive index, for example, of approximately 1.8 or more to contribute to light extraction efficiency.

The exemplary OED may include the substrate including the base film and the inorganic material layer, a first electrode layer, an organic material layer, a second electrode layer, a second inorganic material layer, and a cover film, which are sequentially present in a top direction. The layers may be directly stacked between adjacent layers without a different layer, or may be stacked by means of a different layer.

The term "top direction" used herein refers to, unless particularly defined otherwise, a direction from the first electrode layer to the second electrode layer, and the term "bottom direction" used herein refers to a direction from the second electrode layer to the first electrode layer.

Hereinafter, in the specification, for convenience of the description, in the above structure, a region including all of the factors present under the first electrode layer (excluding the first electrode layer) is called as a substrate region, a region including the first electrode layer, the second electrode layer, and all of the factors present therebetween is called as a device region, and a region including all of the factors (excluding the second electrode layer) present on the second electrode layer is called as an upper region.

The substrate region may have a haze in a range of 3 to 90, 3 to 85, 3 to 50, or 3 to 30%. Such a haze range may be advantageous to, for example, increase a light extraction efficiency. When needed, for a higher light extraction efficiency, as to be described below, another factor such as a gap between an emitting layer and the electrode layer may also be controlled. However, when a structure in which light is emitted from an organic layer to the top direction is designed, a haze of the substrate region is not necessarily included within the above-described range. To control the haze of the substrate region, the haze of the base film in the substrate region may be controlled, or a scattering layer or scattering adhesive which will be described below may be applied.

The substrate region may include an additional layer. As the layer additionally present in the substrate region, a scattering layer, a buffer layer, a carrier substrate, a barrier film, or an adhesive layer may be used.

The buffer layer may be formed to ensure interlayer cohesion or to control surface roughness of the above-described base film. When the scattering layer is formed on the base film, for example, the buffer layer may be formed thereon, or between the barrier layer and the first electrode layer, but the present application is not limited. As to be described below, when needed, a buffer layer may be formed in an upper region. In the specification, for convenience of discrimination, the buffer layer formed in the substrate region may be a first buffer layer, and the buffer layer formed in the upper region may be a second buffer layer.

The buffer layer may be formed as a high refractive layer. The term "high refractive layer" used herein may be a layer having a refractive index of approximately 1.6, 1.65, 1.7, or 1.75 or more. The upper limit of the refractive index of the high refractive layer may be, but is not particularly limited to, for example, approximately 2.5 or 2.0. Such a refractive index may be advantageous to improve, for example, light extraction efficiency.

The buffer layer may be formed of a suitable material which can efficiently form the buffer layer, and suitably ensure interlayer cohesion or a planarization degree without particular limitation. The buffer layer may be formed of, for example, a metal such as Al, an inorganic material such as SiOx, SiOxNv, SiNx, AlOx, ZnSnOx, ITO, ZnO, IZO, ZnS, MgO, or SnOx, a polyimide, a caldo resin having a fluorene ring, a urethane, an epoxide, a polyester, a poly(amic acid), a polyimide, a polyethyleneimine, a polyvinylalcohol, a polyamide, a polythiol, a poly((meth)acrylate), or an organic material such as organic silicon. Here, as the organic silicon, the compound cited in the category of the inorganic layer or a polymer including the compound as a polymerization unit may be used. In another example, the buffer layer may be formed of a material prepared by blending a compound of an alkoxide or acylate of a metal such as zirconium, titanium, or cerium with a binder having a polar group such as a carboxyl group or a hydroxyl group. The compound of the alkoxide or acylate may be condensed with the polar group of the binder, and include the metal in a backbone of the binder, thereby realizing a high refractive index. As an example of the alkoxide or acylate compound, a titanium alkoxide such as tetra-n-butoxy titanium, tetraisopropoxy titanium, tetra-n-propoxy titanium, or tetraethoxy titanium, titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate may be used.

The buffer layer may be formed by selecting a suitable material from the above-described materials. When the buffer layer requires a high refractive index, a material having a high refractive index selected from the above-described materials, or a material prepared by blending a suitable material selected therefrom with high refractive particles or by introducing a high refractive material such as a Ti precursor to the above material may be used. The term "high refractive particles" used herein may be, for example, particles having a refractive index of 1.5, 2.0, 2.5, 2.6, or 2.7 or more. The upper limit of the refractive index of the high refractive particles may be, for example, selected in the range which can satisfy a desired refractive index. The high refractive particles may have an average particle diameter of, for example, approximately 1 to 100, 10 to 90, 10 to 80, 10 to 70, 10 to 60, 10 to 50, or 10 to 45 nm. The high refractive particles may be alumina, alumino silicate, titanium oxide, or zirconium oxide. As the high refractive particles, for example, particles having a refractive index of 2.5 or more, rutile-type titanium oxide may be used. The rutile-type titanium oxide may have a relatively high refractive index, compared to common particles, and therefore can be controlled to have a desired refractive index even in a relatively small ratio.

A method of forming a buffer layer may be, but is not particularly limited to, for example, a suitable one of the PVD and CVD, and particularly, iCVD. In another example, the buffer layer may be formed by preparing a coating solution by blending a metal alkoxide such as titanium alkoxide or zirconium alkoxide with a solvent such as alcohol or water, applying the coating solution, and performing various wet or dry coating methods including a sol-gel coating method of plasticizing the coated solution at a suitable temperature.

The thickness of the buffer layer is not particularly limited, and may be suitably selected in consideration of a position at which the buffer layer is formed and required functions. For example, when the buffer layer is formed on the scattering layer to ensure a planarized surface, it may have a relatively large thickness, compared to when the buffer layer is formed on the base film.

The substrate region may further include a scattering layer to ensure a suitable haze. The term "scattering layer" used herein may be all types of layers formed to scatter, refract, or diffract light incident on the scattering layer. A shape of the scattering layer realized to have the above-described function is not particularly limited.

For example, the scattering layer may be a layer including a matrix material and a scattering region. The term "scattering region" used herein may be, for example, a region which has a different refractive index from that of the matrix material or another surrounding material such as the buffer layer, and has a suitable size, thereby scattering, refracting, or diffracting incident light. The scattering region may be, for example, particles or an empty space. For example, the scattering region may be formed using particles having a refractive index which is different from and higher or lower than the surrounding materials. The refractive index of the scattering particles may have a difference between the surrounding material, for example, the matrix material and/or the buffer layer of more than 0.3 or 0.3 or more. For example, the scattering particles may have a refractive index of approximately 1.0 to 3.5 or 1.0 to 3.0. The scattering particles may have a refractive index of, for example, 1.0 to 1.6 or 1.0 to 1.3. In another example, the scattering particles may have a refractive index of approximately 2.0 to 3.5 or 2.2. to 3.0. The scattering particles may have an average particle diameter of, for example, 50, 100, 500, or 1,000 nm or more. The average particle diameter of the scattering particles may be, for example, 10,000 nm or less. The scattering region may also be formed with an empty space having the above size, which is charged with an air.

The scattering particle or region may be formed in a spherical, oval, polygonal, or amorphous shape, but the shape is not particularly limited. As the scattering particles, for example, particles including an organic material such as polystyrene or a derivative thereof, an acrylic resin or a derivative thereof, a silicon resin or a derivative thereof, or a novolac resin or a derivative thereof, or an inorganic material such as silica, alumina, titanium oxide, or zirconium oxide may be used. The scattering particles may be formed only of any one of the above materials or at least two thereof. For example, as the scattering particles, hollow particles or particles having a core/shell structure such as hollow silica may also be used. The scattering layer may further include a matrix material maintaining a scattering region such as the scattering particles. The type of the matrix material that can be used may be, but is not particularly limited to, for example, a suitable material selected from the above-described materials to be used in forming the buffer layer.

In another example, the scattering layer may be a layer having an uneven structure. The uneven structure of the scattering layer may be suitably controlled, and when needed, when the buffer layer having a suitable refractive index thereon is formed, incident light may be scattered. The scattering layer having the uneven structure may be manufactured by forming an uneven structure having a desired shape by, for example, curing a heat- or photo-curable material in contact with a mold which can transfer a desired shaped uneven structure while curing, or through an etching process after a material for forming the scattering layer is previously formed. In another method, the scattering layer may be formed by blending particles having suitable size and shape in a binder for forming the scattering layer. In this case, the particles are not necessarily particles having a scattering function, but may be particles having a scattering function.

The scattering layer may be formed by, for example, a coating method such as wet or dry coating, or a deposition method such as PVD or CVD, and alternatively may be formed by nanoimprinting or microembossing.

As another layer which can be included in the substrate region, a barrier film may be used. Compared to a rigid structure using a substrate having an excellent barrier property of the properties of the material such as a glass substrate, in a flexible structure, a base film having a relatively low barrier property may be applied, and therefore to compensate the barrier property, an additional barrier film may be present, for example, under the base film. As the barrier film, one which can ensure a suitable barrier property and transmissivity when needed may be used without particular limitation.

The barrier film may be adhered to the base film, for example, using an adhesive layer. The term "adhesive layer" used herein includes materials conventionally called as an adhesive, and layers formed using a material called as a pressure-sensitive adhesive and a material called as a pressure-sensitive adhesive/adhesive (?). The material for forming the adhesive layer may be, but is not particularly limited to, for example, a known pressure-sensitive adhesive/adhesive material such as an acrylic polymer, a silicon polymer, a rubber-based polymer, an ethylene vinyl acetate (EVA) polymer, or an olefin polymer such as polyisobutylene (PIB).

A suitable water-proof material may be blended with the adhesive layer. Hereinafter, the term "adhesive layer blended with the water-proof material" used herein may be an adhesive layer having a barrier property. The term "water-proof material" used herein may be used as a component which can adsorb or remove water or vapor introduced from an external environment through a physical or chemical reaction. A specific type of the water-proof material which can be blended with the adhesive layer may be, but is not particularly limited to, one or a mixture of at least two of, for example, a metal oxide, an organic metal oxide, a metal salt, and phosphorus pentoxide ($P_2O_5$). Here, a specific example of the metal oxide may be lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

Suitable scattering particles may be blended in the adhesive layer, and thus the adhesive layer may exhibit a suitable haze. When the adhesive layer exhibits a haze, light extraction efficiency may be improved. A type of the scattering particles which can be blended in the adhesive layer is not particularly limited, and a suitable type may be selected from the scattering particles included in the scattering layer in consideration of the refractive index of a resin for forming the adhesive layer.

As another layer which may be present in the substrate region, a carrier substrate which may be temporarily or permanently adhered under the base film may be used. Conventionally, as the carrier substrate, a rigid substrate such as a glass substrate may be used.

The substrate region may be formed in various structures. For example, the substrate region may have a structure in which a first inorganic layer and a base film are sequentially formed in a bottom direction, a structure in which a buffer layer and/or a scattering layer are formed between the first inorganic layer and the base film, or a structure in which a carrier film or a barrier film is adhered under the base film by an adhesive layer when needed.

An organic material layer is present between the first and second electrode layers. The organic material layer may include at least one or two emitting units. In such a structure, light generated from the emitting unit may be emitted to a transparent electrode layer through reflection by a reflective electrode layer.

When at least two emitting units are present, for suitable emission, an intermediate electrode layer or charge-generating layer may be further present between the plurality of emitting units. Accordingly, the emitting units may be divided by the intermediate electrode layer or charge-generating layer having a charge-generating characteristic.

A material constituting the emitting unit is not particularly limited. A fluorescent or phosphorescent organic material having various emission center wavelengths is known in the art, and a suitable type may be selected from such known materials, thereby forming the emitting unit. The material for the emitting unit may be, but is not limited to, an Alq-based material such as tris(4-methyl-8-quinolinolate)aluminum(III) (Alq3), 4-MAlq3, or Gaq3; a cyclopentadiene derivative such as C-545T($C_{26}H_{26}N_2O_2S$), DSA-amine, TBSA, BTP, PAP-NPA, spiro-FPA, PhTDAOXD ($Ph_3Si$), or 1,2,3,4,5-pentaphenyl-1,3-cyclopentadiene (PPCP); 4,4'-bis(2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N]iridium(III) (FIrppy), or bis(2-(2'-benzo[4,5-a]thienyl)pyridinato-N,C3')iridium(acetylactonate) ($Btp_2Ir(acac)$). The emitting layer may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emitting characteristic selected from electron accepting organic compounds or electron donating organic compounds, which will be described later.

The organic material layer may be formed in various structures further including various functional layers known in the art, as long as it includes the emitting unit. As a layer capable of being included in the organic material layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene or phenanthrene, or a derivative thereof; or a heterocyclic compound such as phenanthroline, bathophenanthroline, phenanthridine, acridine, quinoline, quinoxaline, or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylene dimethylidine, 2,6-naphthylenedimethylidine, 1,4-biphenylenedimethylidine, 1,4-para-terephenylene dimethylidine, 9,10-anthracenediyldimethylidine, or 4,4'-(2,2-di-ti-butylphenylvinyl)biphenyl or 4,4'-(2,2-diphenylvinyl)biphenyl, or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styryl amine derivative disclosed in a patent publication such as Japanese Patent Laid-Open Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the device by preventing approach of injected holes to an electron injection electrode layer through the emitting layer, and may be formed in a suitable part between the emitting layer and the electron injection electrode layer using a known material when necessary.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene, or 4,4"-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole), or a σ-conjugated polymer of polysilane may also be used.

The hole injection layer may be formed using an electrically-conductive polymer such as a metal phthalocyanine such as copper phthalocyanine or a non-metal phthalocyanine, a carbon film, and polyaniline, or may be formed by reaction with a Lewis acid using the aryl amine compound as an oxidizing agent.

A particular structure of the organic layer is not particularly limited. Various materials and methods for forming a hole or electron injection electrode layer and an organic layer, for example, an emitting layer, an electron injection or transport layer, or a hole injection or transport layer are known in the art, and to manufacture the OED, all of the methods may be used.

An upper region of the OED may include an inorganic material layer and a cover film, which are sequentially formed in a top direction. To discriminate the inorganic material layer from that of the substrate for an OED, the inorganic material layer included in the upper region may be referred to as a second inorganic material layer, and the inorganic material layer included in the substrate may be referred to as a first inorganic material layer.

The second inorganic material layer is present to prevent, inhibit, or reduce the permeation of external materials, thereby obtaining durability, and specific material and forming method may be similar to those described in the category of the first inorganic material layer. However, when the second inorganic material layer is designed to emit light to the substrate region, it is not necessary to form the second inorganic material layer to have a high refractive index, which is the same as that of the first inorganic material layer.

A cover film present on the second inorganic material layer may be a structure for protecting an OED, which is, for example, a known barrier film, metal sheet, or conductive film, or a stack structure of at least two thereof. The cover film in the upper region may be adhered to a top surface of the second inorganic material layer by an adhesive layer, for example, the above-described adhesive layer having a barrier property.

Still another aspect of the present application provides a use of the OED, for example, an OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights.

In one embodiment, the present application relates to a lighting device including the OLED. When the OLED is applied to the lighting device or for different uses, other components constituting the device or a method of constituting the device is not particularly limited, but all of optional materials or methods known in the related art may be employed as long as these are used in the OLED.

Yet another aspect of the present application provides a method of manufacturing the substrate for an OED.

That is, the present application may relate to a method of manufacturing a substrate for an OED, which includes forming an inorganic material layer by forming a stack structure of first and second sub layers, which has a thickness of 7 nm or less, on a base film. The substrate for an OED may prevent crystallization of the inorganic material layer by forming a sub layer having a thickness of 7 nm or less, and ensure a desired WVTR, for example, in a range of $10^{-6}$ to $10^{-3}$ g/m$^2$/day.

The sub layer constituting the inorganic material layer may be manufactured from all of the materials described in the OED to have a thickness in a range that can prevent partial crystallization of the inorganic material layer by any one of the known methods including the ALD described above for forming a multilayer film without limitation.

That is, the inorganic material layer of the present application may be formed by applying any one or at least two of the above-described methods of forming an inorganic material layer. For example, an inorganic material layer may be formed by forming a first sub layer using the above-described material for forming a sub layer and the ALD, and then repeatedly forming a second sub layer using a different material from that of the first sub layer and the ALD.

An example of the method of forming the inorganic material layer, that is, the principle of the ALD, may be explained by depositing a thin film formed of a solid material such as AB using gas-type materials such as AX and BY as source materials, and generating a gas-type byproduct such as XY, and a chemical reaction formula is simply shown in Reaction Formula 1.

$AX(\text{gas}) + BY(\text{gas}) \rightarrow AB(\text{solid}) + XY(\text{gas})$     [Reaction Formula 1]

That is, according to the ALD, a gas-type AX material is provided to be adsorbed to a surface of a substrate, remaining AX is removed using an inert material such as an argon gas, and a gas-type BY material is provided to react with the AX adsorbed to the substrate. Afterward, a process of removing the remaining BY and the byproduct XY may be repeatedly performed.

According to the ALD, an inorganic material layer may be formed on a base film to a desired thickness, and partial crystallization of the inorganic material layer may be prevented.

Particularly, the first and second sub layers of the inorganic material layer of the present application may be formed to have a thickness of 7 nm or less using ALD. Due to such a thickness, the partial crystallization of the desired inorganic material layer may be prevented.

In addition, the first and second sub layers may be alternately formed, thereby forming an inorganic material layer having a multilayer structure.

A refractive index of the inorganic material layer with respect to a wavelength of 550 nm may be suitably selected in consideration of the above-described ranges of the refractive indexes of the first electrode layer and the base film, and as an example, the refractive index of the inorganic material layer may be 1.8 to 2.2. The range of the refractive index may be determined by the refractive index of the base film, the thickness of the sub layer, and the type of the material for forming the sub layer.

The substrate for an OED manufactured by the method of manufacturing a substrate for an OED may achieve a WVTR suitable to be used in a display including an OED, and compared to a known monolayer structure of an inorganic barrier layer or a structure in which a plurality of inorganic barrier layers are stacked by means of an adhesive layer, a substrate for an OED having an excellent WVTR, an excellent optical characteristic, and improved durability may be provided.

BRIEF DESCRIPTION OF THE DRAWINGS

The above and other objects, features, and advantages of the present application will become more apparent to those of ordinary skill in the art by describing in detail exemplary embodiments thereof with reference to the adhered drawings, in which:

FIG. 1 is a schematic diagram of an exemplary substrate for an OED; and

FIGS. 2 and 3 are images of inorganic material layers according to Example and Comparative Example.

DETAILED DESCRIPTION OF EXEMPLARY EMBODIMENTS

Hereinafter, exemplary embodiments of the present application will be described in detail with reference to Examples according to the present application and Comparative Examples not according to the present application. However, the scope of the present application is not limited to the embodiments to be disclosed below.

1. Method of Measuring WVTR

A WVTR of a substrate for an OED was measured by operating a specimen (10 cm×10 cm) of a substrate including an inorganic material layer at 40° C. and a relative humidity of 90% according to a manual of PERMATRAN-W3/31 (MOCON, Inc.).

EXAMPLE 1

An inorganic material layer was formed on a flexible base film such as a polyimide (PI) film as a barrier layer by the following method. First, the PI film was disposed on a carrier substrate, which is an organic substrate, and an inorganic material layer was formed by ALD. The inorganic material layer was formed to have a final refractive index of approximately 1.8 to 2.2 by alternately: depositing an $Al_2O_3$ layer having a refractive index of approximately 1.6 to 1.8 and a $TiO_2$ layer having a refractive index of approximately 2.0 to 2.4 when each layer was deposited alone. The $Al_2O_3$ layer was formed by alternately adsorbing a trimethylaluminum layer and a water ($H_2O$) layer as precursors at approximately 200° C. by ALD known in the art, and the $TiO_2$ layer was formed by alternately adsorbing a $TiCl_4$ layer and a water ($H_2O$) layer as precursors at approximately 200° C. by the ALD known in the art. A structure of the formed inorganic material layer included an $Al_2O_3$ layer (thickness: 4.5 nm)/$TiO_2$ layer (thickness: 6.3 nm)/$Al_2O_3$ layer (thickness: 3.9 nm)/$TiO_2$, layer (thickness: 5.8 nm)/$Al_2O_3$ layer (thickness: 3.8 nm)/$TiO_2$ layer (thickness: 5.8 nm). A TEM image of the inorganic material layer is shown in FIG. 2, and the WVTR and crystallization of the substrate were analyzed as show in Table 1 below.

EXAMPLE 2

A substrate was manufactured by the same method as described in Example 1, except that the inorganic material layer was formed in a bilayer structure ($Al_2O_3$/$TiO_2$/$Al_2O_3$/$TiO_2$).

COMPARATIVE EXAMPLE 1

An $Al_2O_3$ layer was formed to a thickness of approximately 36 mm on the same PI film as that used in Example 1 by sputtering. The formed inorganic material layer is shown in FIG. 3, and the WVTR and crystallization of the substrate were analyzed as shown in Table 1 below.

TABLE 1

|  | Example 1 | Example 2 | Comparative Example 1 |
|---|---|---|---|
| Crystallization | Not crystallized | Not crystallized | Crystallized |
| WVTR | $10^{-5}$ g/m²/day | $10^{-4}$ g/m²/day | $10^{-1}$ g/m²/day |

The present application can provide a substrate for an OED, a method of manufacturing the same, and a use thereof. The substrate of the present application includes a flexible base film and an inorganic material layer, and the inorganic material layer includes a multilayer structure of at least two thin layers. Such an inorganic material layer can have an excellent physical property, for example, a barrier property, by inhibiting crystallinity. In addition, by employing the multilayer structure, an inorganic material layer having a physical property which is difficult to be realized by a conventional inorganic material layer, for example, a high refractive index, in addition to the barrier property can be formed.

While the invention has been shown and described with reference to certain exemplary embodiments thereof, it will be understood by those skilled in the related art that various changes in form and details may be made therein without departing from the scope of the invention as defined by the appended claims.

What is claimed is:

1. An organic electronic device (OED), comprising:
a substrate for the organic electronic device (OED), and
a device region having a first electrode layer, an organic material layer, and a second electrode layer,
wherein the substrate comprises:
a flexible base film having a haze of 40% to 90% and having a glass transition temperature of about 200° C. or more, and a refractive index with respect to light having a wavelength of 550 nm of 1.8 or more and comprising scattering particles having an average particle diameter of 50 to 100 nm; and
an inorganic material layer formed on the base film and including a stack structure of alternating first and second sub layers each having a thickness of 7 nm or less,
wherein the inorganic material layer has a thickness of 10 to 100 nm,
wherein the inorganic material layer includes 4 sub layers or more and 45 sub layers or less, and does not include a sub layer having a thickness of more than 7 nm,
wherein the inorganic material layer and the base film have a difference in refractive index of 1 or less,
wherein the device region is on the inorganic material layer of the substrate,
wherein the first electrode layer is a transparent electrode layer and the second electrode layer is a reflective electrode layer,
wherein the first electrode layer is closer to the substrate than the second electrode layer, and
wherein the base film comprises a functional group chemically reacted with the inorganic material layer, and the functional group is at least one selected from the group consisting of a hydroxyl group, an amino group and carboxyl group.

2. The organic electronic device (OED) according to claim 1, wherein the first sub layer and the second sub layer are stacked in contact with each other, and are each of a different material selected from an oxide, a nitride and an oxynitride.

3. The organic electronic device (OED) according to claim 1, wherein the inorganic material layer further includes a third sub layer of a material different from the first and second sub layers.

4. The organic electronic device (OED) according to claim 1, wherein the first sub layer has a refractive index with respect to a wavelength of 550 nm of 1.4 to 1.9, and the second sub layer has a refractive index with respect to a wavelength of 550 nm of 2.0 to 2.6.

5. The organic electronic device (OED) according to claim 1, wherein the inorganic material layer has a refractive index with respect to a wavelength of 550 nm of 1.8 to 2.2.

6. The organic electronic device (OED) according to claim 1, wherein the substrate has a water vapor transmission rate (WVTR) of $10^{-6}$ to $10^{-3} g/m^2/day$.

7. A light source for a display, comprising:
the OED of claim 1.

8. A lighting device, comprising:
the OED of claim 1.

9. The organic electronic device (OED) of claim 1, wherein the scattering particles comprise hollow particles or particles having a core/shell structure.

10. The organic electronic device (OED) of claim 1, wherein the first sub layer comprises $Al_2O_3$ and the second sub layer comprises $TiO_2$.

* * * * *